(12) United States Patent
Jeong et al.

(10) Patent No.: US 10,972,067 B2
(45) Date of Patent: Apr. 6, 2021

(54) FILTER AND MULTIPLEXER

(71) Applicant: TAIYO YUDEN CO., LTD., Tokyo (JP)

(72) Inventors: Jaeho Jeong, Tokyo (JP); Shuei Hashimoto, Tokyo (JP); Naoyuki Tasaka, Tokyo (JP); Sachiko Tanaka, Tokyo (JP); Makoto Inoue, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/719,260

(22) Filed: Dec. 18, 2019

(65) Prior Publication Data

US 2020/0235714 A1 Jul. 23, 2020

(30) Foreign Application Priority Data

Jan. 17, 2019 (JP) .............................. JP2019-006380

(51) Int. Cl.
*H03H 7/01* (2006.01)

(52) U.S. Cl.
CPC ........ *H03H 7/1783* (2013.01); *H03H 7/0153* (2013.01); *H03H 2007/013* (2013.01)

(58) Field of Classification Search
CPC .................................................. H03H 7/1783

USPC ........................................................ 333/175
See application file for complete search history.

(56) References Cited

U.S. PATENT DOCUMENTS 10,700,666 B2 *  6/2020  Tanaka ................. H03H 7/1708
10,826,460 B2 * 11/2020  Itou ........................ H03H 9/706

FOREIGN PATENT DOCUMENTS

JP         H 10-135864 A      5/1998
JP         2018-129683 A      8/2018

* cited by examiner

*Primary Examiner* — Hai L Nguyen
(74) *Attorney, Agent, or Firm* — Stein IP, LLC

(57) ABSTRACT

A filter includes: a substrate; input and output terminals located on the substrate; a resonant circuit located in a series pathway between the input and output terminals; a first component including a first inductor, which is electrically connected between a first node in the series pathway and a ground, and mounted in a first region on the substrate; a second component including a second inductor, which is electrically connected between a second node different from the first node in the series pathway and a ground, and mounted in a second region different from the first region on the substrate; and a third component including an acoustic wave resonator, which is electrically connected between a third node between the first and second nodes in the series pathway and a ground, and mounted in a third region between the first and second regions on the substrate.

10 Claims, 13 Drawing Sheets

FILTER AND MULTIPLEXER

CROSS-REFERENCE TO RELATED APPLICATION

This application is based upon and claims the benefit of priority of the prior Japanese Patent Application No. 2019-006380, filed on Jan. 17, 2019, the entire contents of which are incorporated herein by reference.

FIELD

A certain aspect of the present embodiments relates to a filter and a multiplexer.

BACKGROUND

There has been known a filter in which a resonator such as an acoustic wave resonator is provided to a resonant circuit formed of a capacitor and an inductor as disclosed in, for example, Japanese Patent Application Publication No. 2018-129683 (hereinafter, referred to as Patent Document 1). It has been known to provide an inductor shunt-connected to each of an input terminal and an output terminal.

SUMMARY OF THE INVENTION

According to a first aspect of the present embodiments, there is provided a filter including: a substrate; an input terminal located on the substrate; an output terminal located on the substrate; a resonant circuit located in a series pathway between the input terminal and the output terminal; a first component including a first inductor and mounted in a first region on the substrate, the first inductor having a first end electrically connected to a first node in the series pathway and a second end electrically connected to a ground; a second component including a second inductor and mounted in a second region on the substrate, the second inductor having a first end electrically connected to a second node in the series pathway and a second end electrically connected to a ground, the second node being different from the first node, the second region being different from the first region; and a third component including an acoustic wave resonator and mounted in a third region on the substrate, the acoustic wave resonator having a first end electrically connected to a third node in the series pathway and a second end electrically connected to a ground, the third node being located between the first node and the second node, the third region being located between the first region and the second region.

According to a second aspect of the present invention, there is provided a multiplexer including the above filter.

DETAILED DESCRIPTION

Steepness between the passband and the stopband is increased by providing a resonator such as an acoustic wave resonator to an LC resonant circuit. However, the loss in the passband may increase and the attenuation in the stopband may decrease.

Hereinafter, a description will be given of embodiments with reference to the accompanying drawings.

First Embodiment

Figure 1:
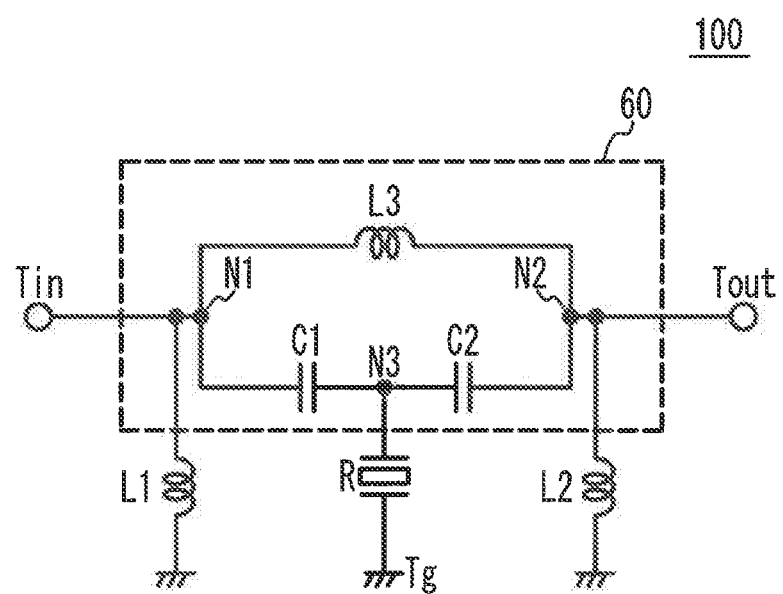
FIG. 1 is a circuit diagram of a filter in accordance with a first embodiment.

FIG. 1 is a circuit diagram of a filter in accordance with a first embodiment. As illustrated in PG. 1, a filter 100 in accordance with the first embodiment includes a resonant circuit 60, an acoustic wave resonator R, and inductors L1 and L2. The resonant circuit 60 includes capacitors C1 and C2 and an inductor L3. The capacitors C1 and C2 are connected in series with each other between an input terminal Tin and an output terminal Tout. The inductor L3 is connected in parallel to the capacitors C1 and C2 between a node N1, which is between the input terminal Tin and the capacitor C1, and a node N2, which is between the output terminal Tout and the capacitor C2. A first end of the acoustic wave resonator R is coupled to a node N3 between the capacitors C1 and C2, and a second end of the acoustic wave resonator R is coupled to a ground terminal Tg. A first end of the inductor L1 is coupled to the node N1, and a second end of the inductor L1 is coupled to the ground terminal Tg. A first end of the inductor L2 is coupled to the node N2, and a second end of the inductor L2 is coupled to the ground terminal Tg.

The filter 100 functions as a low-pass filter or a high-pass filter. The filter 100 transmits signals in the passband to the output terminal Tout among high-frequency signals input to the input terminal Tin, and suppresses signals in other bands. Even when an inductor is connected instead of the capacitors C1 and C2 and a capacitor is connected instead of the inductor L3, the filter 100 functions as a low-pass filter or a high-pass filter.

Figure 2:
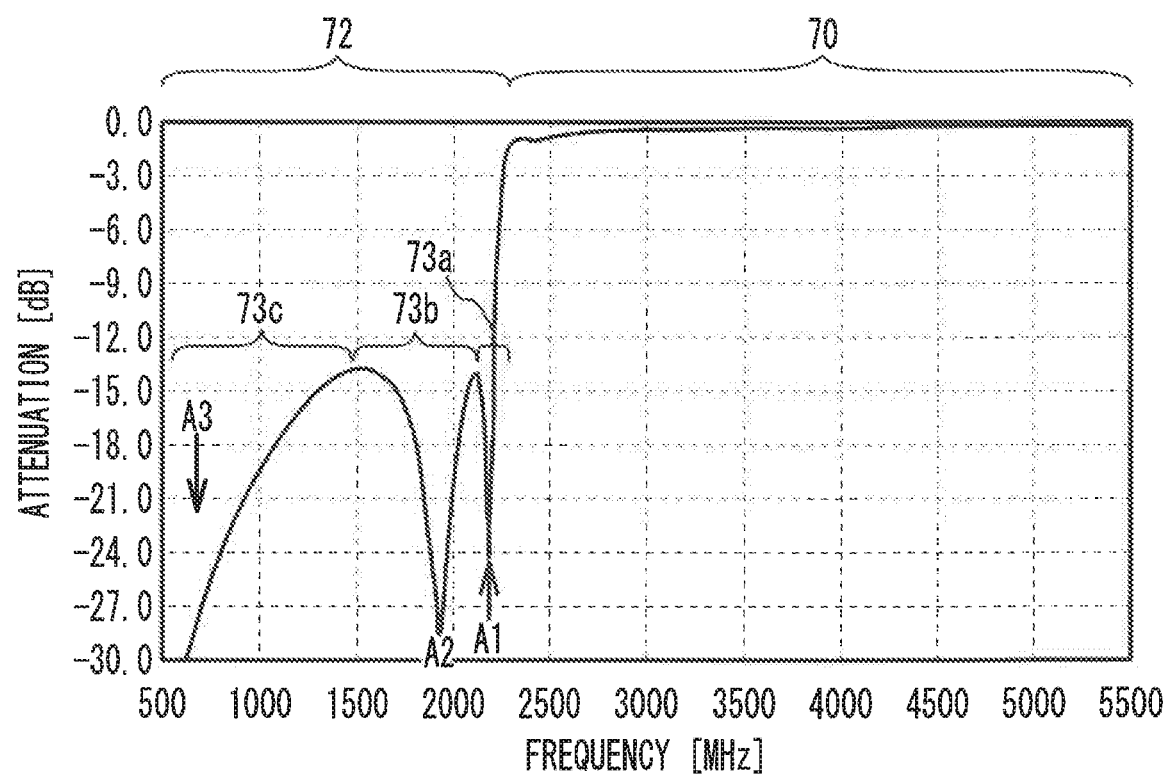
FIG. 2 illustrates transmission characteristics when the filter of the first embodiment is configured to be a high-pass filter.

FIG. 2 illustrates transmission characteristics when the filter of the first embodiment is configured to be a high-pass filter. As illustrated in FIG. 2, a passband 70 is approximately 2300 MHz or higher. In a stopband 72 equal to or less than approximately 2300 MHz, an attenuation pole A1 of approximately 2200 MHz, an attenuation pole A2 of approximately 1900 MHz, and an attenuation pole A3 of approximately 500 MHz are formed. The attenuation characteristic in a region 73a around the attenuation pole A1 is formed mainly by the resonant frequency of the acoustic wave resonator R. The attenuation characteristic in a region 73b around the attenuation pole A2 is formed mainly by the resonant circuit 60. The attenuation characteristic in a region 73c around the attenuation pole A3 is formed mainly by the attenuation poles of the inductors L1 and L2.

The resonant frequency of the acoustic wave resonator R is located between the passband 70 and the attenuation pole A2. This configuration increases the steepness between the stopband 72 and the passband 70. Provision of the inductors L1 and L2 widens the stopband 72.

Figure 3A:
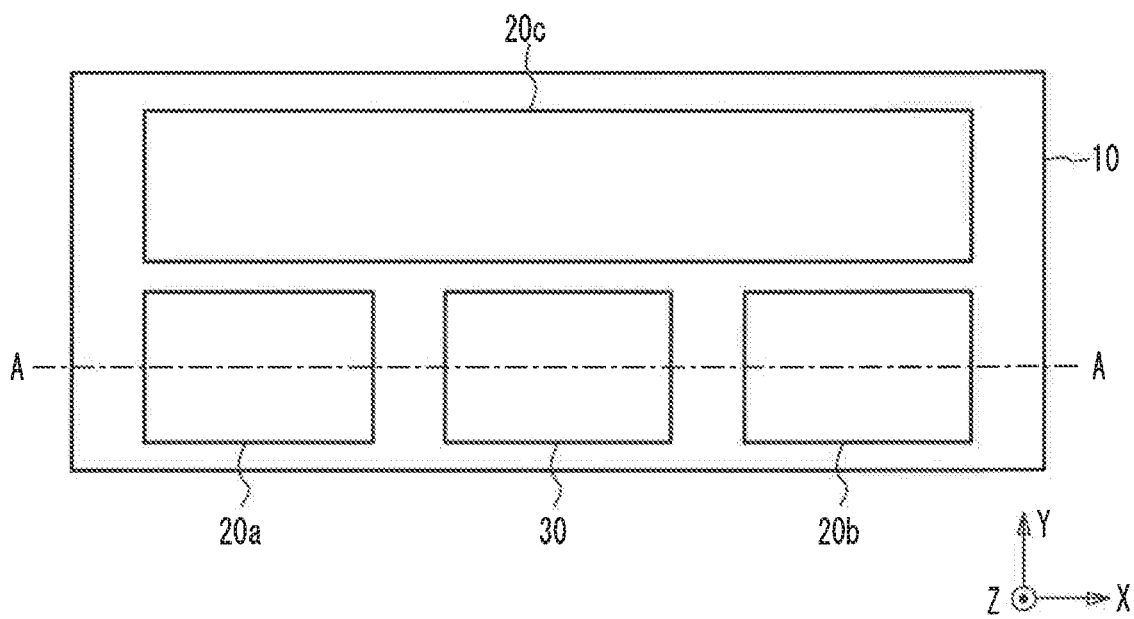
FIG. 3A is a plan view of the filter in accordance with the first embodiment.
Figure 3B:
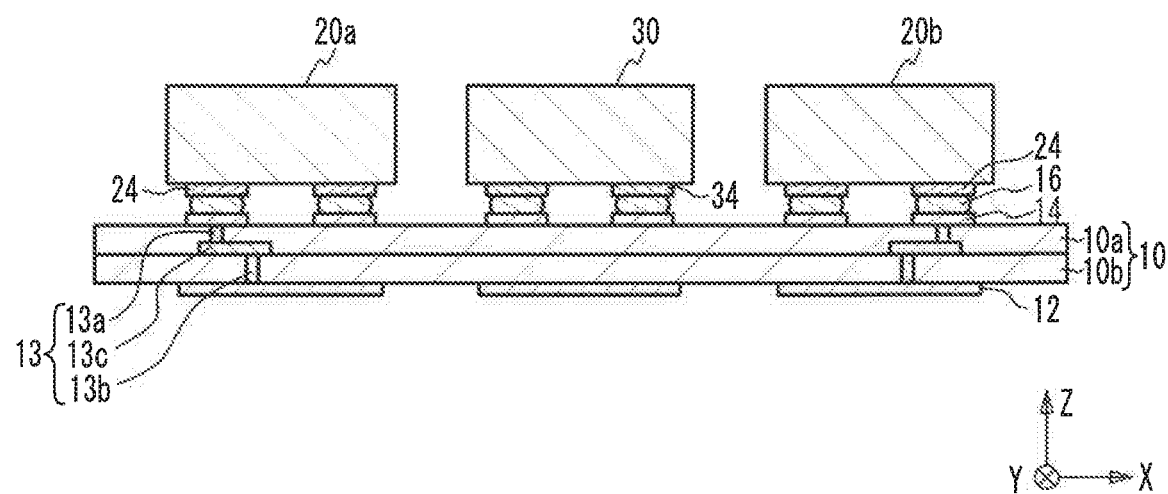
FIG. 3B is a cross-sectional view taken along line A-A in FIG. 3A.

FIG. 3A is a plan view of the filter in accordance with the first embodiment, and FIG. 3B is a cross-sectional view taken along line A-A in FIG. 3A. The direction normal to a circuit substrate 10 (the normal direction of the circuit substrate 10) is defined as a Z direction, the direction in which components 20a, 30, and 20b are arranged (the arrangement direction of components) is defined as an X direction, and the direction perpendicular to the X direction and the Z direction is defined as a Y direction. As illustrated in FIG. 3A and FIG. 3B, components 20a through 20c and 30 are mounted on the circuit substrate 10. The circuit substrate 10 includes a plurality of insulating layers 10a and 10b that are stacked. The insulating layers 10a and 10b are made of an organic insulator such as resin or an inorganic insulator such as ceramic. Terminals 14 are located on the upper surface of the circuit substrate 10, and terminals 12 are located on the lower surface of the circuit substrate 10. The terminals 12 and 14 are, for example, lands. The terminals 12 are terminals for connecting the filter to an external circuit, and correspond to, for example, the input terminal Tin, the output terminal Tout, and the ground terminal Tg. The terminals 12 and 14 are electrically connected through an internal wiring line 13. The internal wiring line 13 includes vias 13a and 13b and a wiring line 13c. The vias 13a and 13b are vias penetrating through the insulating layers 10a and 10b, respectively. The wiring line 13c is a metal pattern located between the insulating layers 10a and 10b. The terminals 12 and 14 and the internal wiring line 13 are formed of a metal layer, such as, but not limited to, a gold layer, an aluminum layer, or a nickel layer.

Terminals 24 are located on the lower surfaces of the components 20a through 20c. Terminals 34 are located on the lower surface of the component 30. Bumps 16 are bonded to the lower surfaces of the terminals 24 and 34, and the bumps 16 are bonded to the upper surfaces of the terminals 14. The bumps 16 are metal bumps such as, but not limited to, gold bumps, copper bumps, or solder bumps. This structure electrically connects the terminals 24 and 34 to the terminals 14. The components 20a, 20b, 20c, and 30 respectively include the inductor L1, the inductor L2, the resonant circuit 60, and the acoustic wave resonator R. The inductor L1, the inductor L2, the resonant circuit 60, and the acoustic wave resonator R are connected by the internal wiring lines 13 of the circuit substrate 10.

Figure 4:
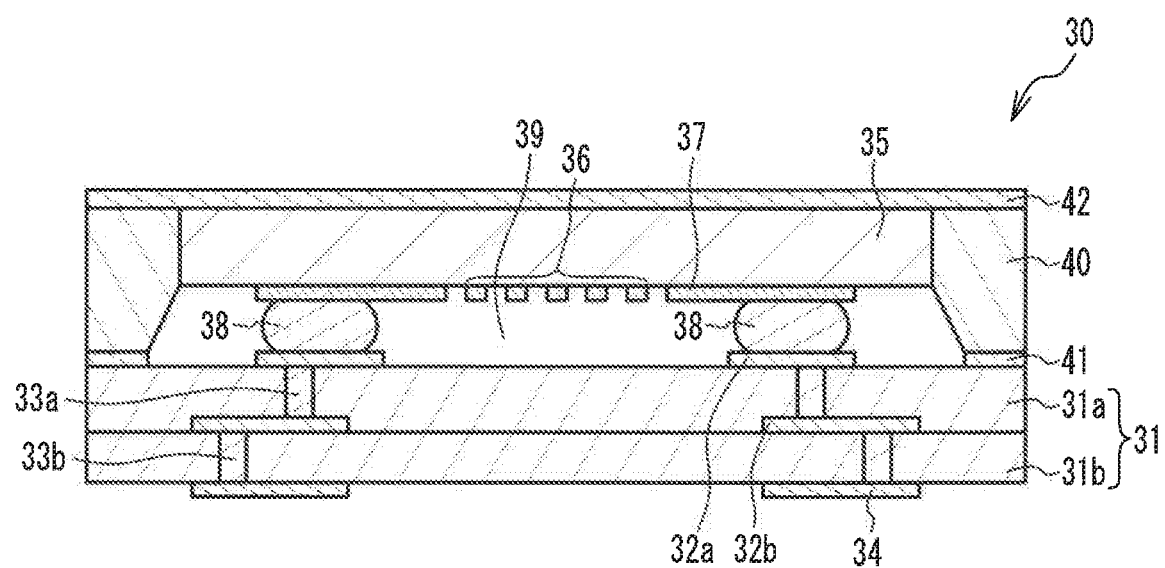
FIG. 4 is a cross-sectional view of a component 30 in the first embodiment.

FIG. 4 is a cross-sectional view of the component 30 in accordance with the first embodiment. As illustrated in FIG. 4, a substrate 35 is mounted on a wiring substrate 31. The wiring substrate 31 includes a plurality of insulating layers 31a and 31b that are stacked. The insulating layers 31a and 31b are, for example, resin layers or ceramic layers. A wiring layer 32a and a ring-shaped metal layer 41 are located on the upper surface of the wiring substrate 31. Wiring layers 32b are located on the insulating layer 31b. Penetrating electrodes 33a and 33b respectively penetrating through the insulating layers 31a and 31b are provided. The terminals 34 are located on the lower surface of the wiring substrate 31. The wiring layers 32a and 32b, the penetrating electrodes 33a and 33b, and the terminals 34 are formed of metal layers such as, but not limited to, copper layers, gold layers, aluminum layers, or nickel layers.

An acoustic wave resonator 36 and wiring lines 37 are located on the lower surface of the substrate 35. The acoustic wave resonator 36 corresponds to the acoustic wave resonator R in FIG. 1. The wiring lines 37 are formed of a metal layer such as, but not limited to, a copper layer, a gold layer, and an aluminum layer. The wiring lines 37 and the wiring layers 32a are bonded by bumps 38. The bumps 38 are metal bumps such as, but not limited to, gold bumps, copper bumps, or solder bumps. The substrate 35 is flip-chip mounted on the wiring substrate 31 with use of the bumps 38 such that the acoustic wave resonator 36 faces the wiring substrate 31 through an air gap 39. The terminal 34 is electrically connected to the acoustic wave resonator 36 through the penetrating electrode 33b, the wiring layer 32b, the penetrating electrode 33a, the wiring layer 32a, the bump 38, and the wiring line 37.

A sealing portion 40 is provided so as to surround the substrate 35. The lower surface of the sealing portion 40 is bonded to the ring-shaped metal layer 41. The sealing portion 40 is made of metal such as solder or an insulator such as resin. A lid 42 is located on the upper surfaces of the substrate 35 and the sealing portion 40. The lid 42 is made of a metal plate or an insulator plate.

Figure 5A:
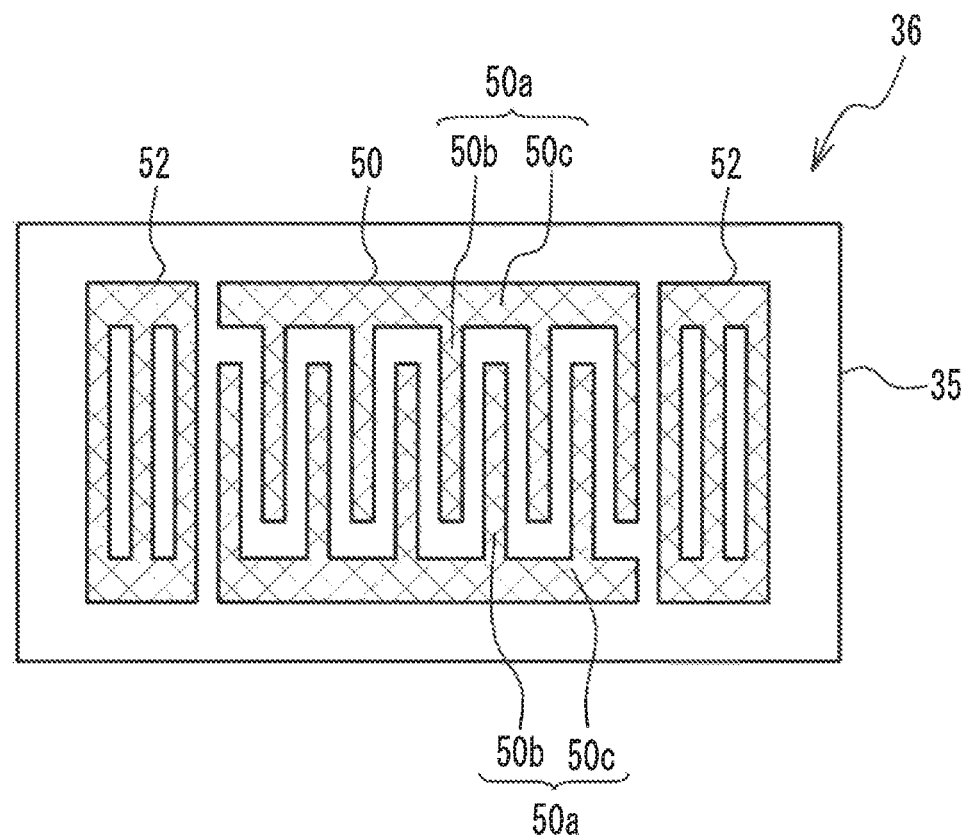
FIG. 5A is a plan view of an acoustic wave resonator in the first embodiment.
Figure 5B:
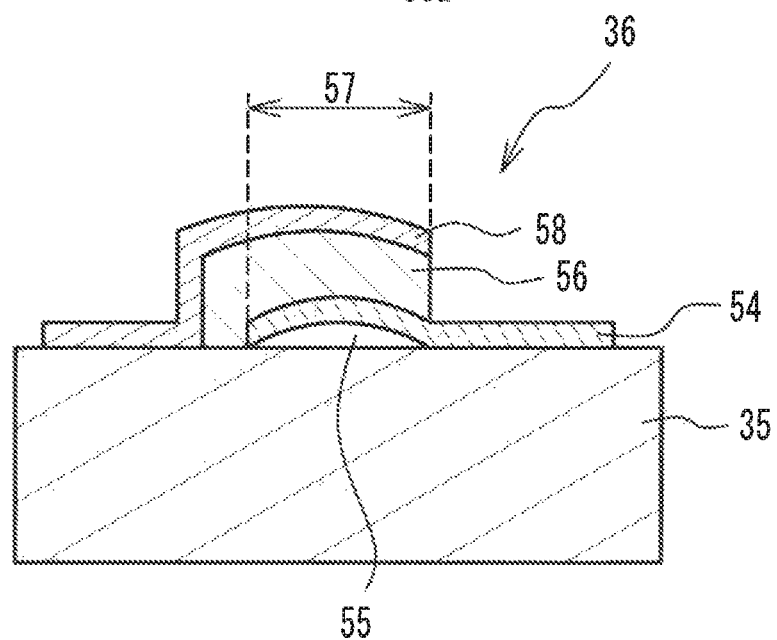
FIG. 5B is a cross-sectional view of another acoustic wave resonator in the first embodiment.

FIG. 5A is a plan view of an acoustic wave resonator in the first embodiment, and FIG. 5B is a cross-sectional view of another acoustic wave resonator in the first embodiment. In the example of FIG. 5A, the acoustic wave resonator 36 is a surface acoustic wave resonator. An interdigital transducer (IDT) 50 and reflectors 52 are located on the upper surface of the substrate 35. The IDT 50 includes a pair of comb-shaped electrodes 50a facing each other. The comb-shaped electrode 50a includes a plurality of electrode fingers 50b and a bus bar 50c connected to the electrode fingers 50b. The reflectors 52 are located at both sides of the IDT 50. The IDT 50 excites the surface acoustic wave on the substrate 35. The substrate 35 is a piezoelectric substrate such as, but not limited to, a lithium tantalate substrate, a lithium niobate substrate, or a crystal substrate. The substrate 35 may be a composite substrate in which a piezoelectric substrate is bonded on a support substrate such as, but not limited to, a sapphire substrate, a spinel substrate, an alumina substrate, a crystal substrate, or a silicon substrate. An insulating film such as, but not limited to, a silicon oxide film or an aluminum nitride film may be located between the support substrate and the piezoelectric substrate. The IDT 50 and the reflectors 52 are formed of, for example, an aluminum film or a copper film. A protective film or a temperature compensation film may be provided on the substrate 35 so as to cover the IDT 50 and the reflectors 52.

In the example of FIG. 5B, the acoustic wave resonator 36 is a piezoelectric thin film resonator. A piezoelectric film 56 is located on the substrate 35. A lower electrode 54 and an upper electrode 58 are provided so as to sandwich the piezoelectric film 56 between the lower electrode 54 and the upper electrode 58. An air gap 55 is formed between the lower electrode 54 and the substrate 35. The region where the lower electrode 54 and the upper electrode 58 face each other across at least a part of the piezoelectric film 56 is a resonance region 57. The lower electrode 54 and the upper electrode 58 in the resonance region 57 excite the acoustic wave in the thickness extension mode in the piezoelectric film 56. The substrate 35 is, for example, a sapphire substrate, a spinel substrate, an alumina substrate, a glass substrate, a crystal substrate, or a silicon substrate. The lower electrode 54 and the upper electrode 58 are formed of a metal film such as, but not limited to, a ruthenium film. The piezoelectric film 56 is, for example, an aluminum nitride film. Instead of the air gap 55, an acoustic mirror reflecting the acoustic wave in the resonance region 57 may be provided.

Figure 6:
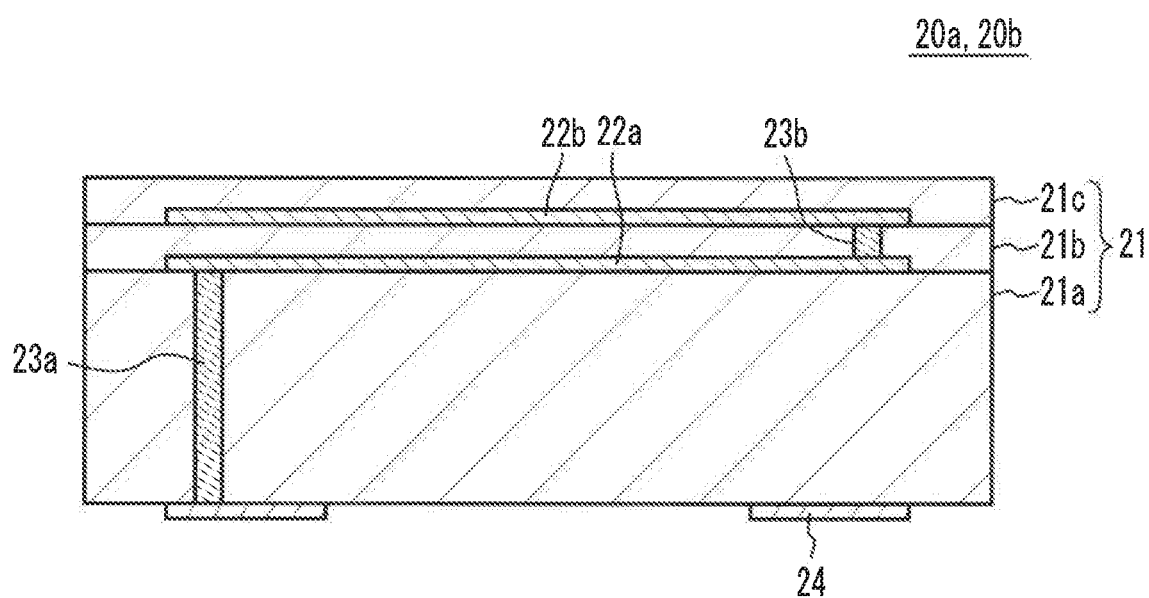
FIG. 6 is a cross-sectional view of components 20a and 20b in the first embodiment.

FIG. 6 is a cross-sectional view of the components 20a and 20b in the first embodiment. As illustrated in FIG. 6, a plurality of dielectric layers 21a through 21c are stacked as a multilayered body 21. Metal patterns 22a and 22b are respectively located on the surfaces of the dielectric layers 21a and 21b. Penetrating electrodes 23a and 23b respectively penetrating through the dielectric layers 21a and 21b are provided. The terminals 24 are located on the lower surface of each of the components 20a and 20b.

The dielectric layers 21a through 21c are made of an inorganic insulator such as, but not limited to, a ceramic material. The dielectric layers 21a through 21c contain an oxide of silicon (Si), calcium (Ca), and magnesium (Mg) (e.g., diopside ($CaMgSi_2O_6$)) as a main component. The metal patterns 22a and 22b, the penetrating electrodes 23a and 23b, and the terminals 24 are formed of metal layers containing, for example, silver (Ag), palladium (Pd), platinum (Pt), copper (Cu), nickel (Ni), gold (Au), a gold-palladium alloy, or a silver-platinum alloy.

In the components 20a and 20b, the metal patterns 22a and 22b form the inductors L1 and L2. In the component 20c, the dielectric layer and the metal pattern are stacked more than in the components 20a and 20b. The dielectric layers and the metal patterns form the capacitors C1 and C2 and the inductor L3.

Simulation

Samples A, B, and C were subjected to a 3D electromagnetic field simulation using a high frequency structure simulator (HESS). The samples A and B correspond to the first embodiment, and the sample C corresponds to a first comparative example.

Figure 7A:
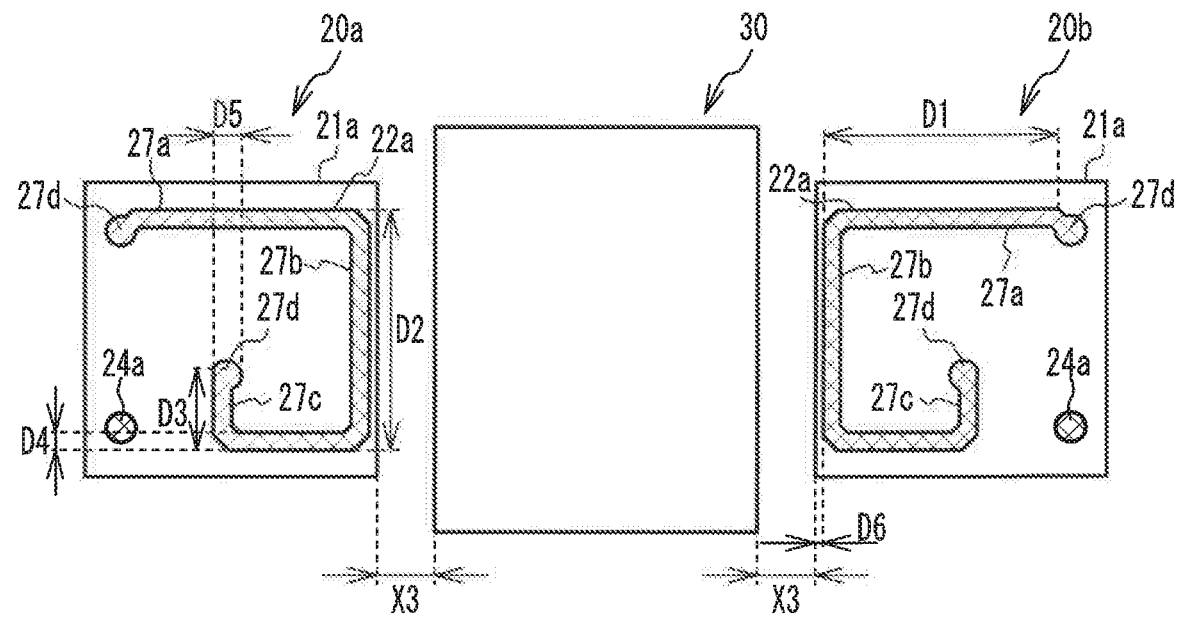
FIG. 7A and FIG. 7B are plan views of a sample A.
Figure 7B:
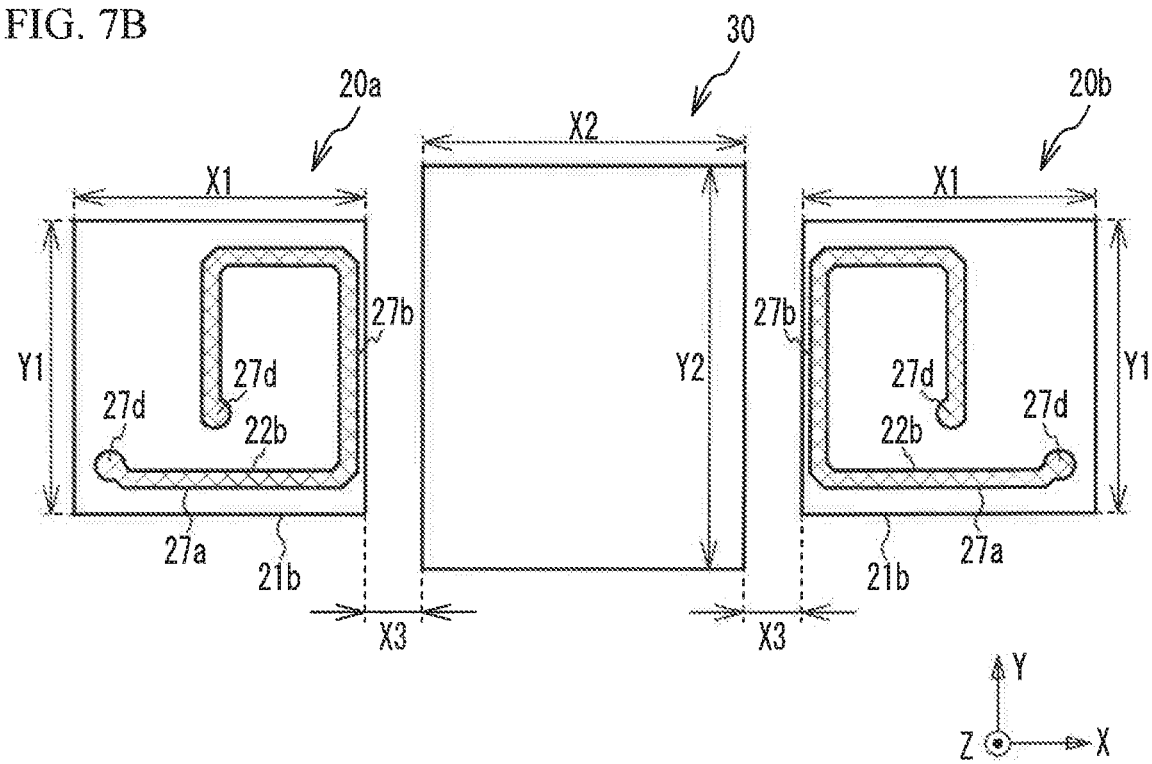

FIG. 7A and FIG. 7B are plan views of the sample A. FIG. 7A illustrates mainly the metal patterns 22a on the dielectric layers 21a in the components 20a and 20b, and FIG. 7B illustrates mainly the metal patterns 22b on the dielectric layers 21b. As illustrated in FIG. 7A and FIG. 7B, the components 20a, 30, and 20b are arranged in the X direction. The metal pattern 22a of the component 20a and the metal pattern 22a of the component 20b are symmetrically arranged against the component 30, and the metal pattern 22b of the component 20a and the metal pattern 22b of the component 20b are symmetrically arranged against the component 30.

The external dimension in the X direction of each of the components 20a and 20b is X1, and the external dimension in the Y direction of each of the components 20a and 20b is Y1. The planar shapes of the components 20a and 20b are squares. The external dimension in the X direction of the component 30 is X2, and the external dimension in the Y direction of the component 30 is Y2. The planar shape of the component 30 is a rectangle, the short side of the rectangle extends in the X direction, and the long side of the rectangle extends in the Y direction. The distance between the component 20a and the component 30 and the distance between the component 20b and the component 30 are X3. The planar shapes of the components 20a through 20c and 30 may be rectangles or other shapes.

Lines 27a, 27b, and 27c of the metal patterns 22a and 22b have lengths of D1, D2, and D3, respectively. The lines 27a through 27c have widths of D4. Pads 27d to which penetrating electrodes 23a and 23b are connected have widths of D5. The distance between the line 27b and the side of each of the dielectric layers 21a and 21b is D6.

Figure 8:
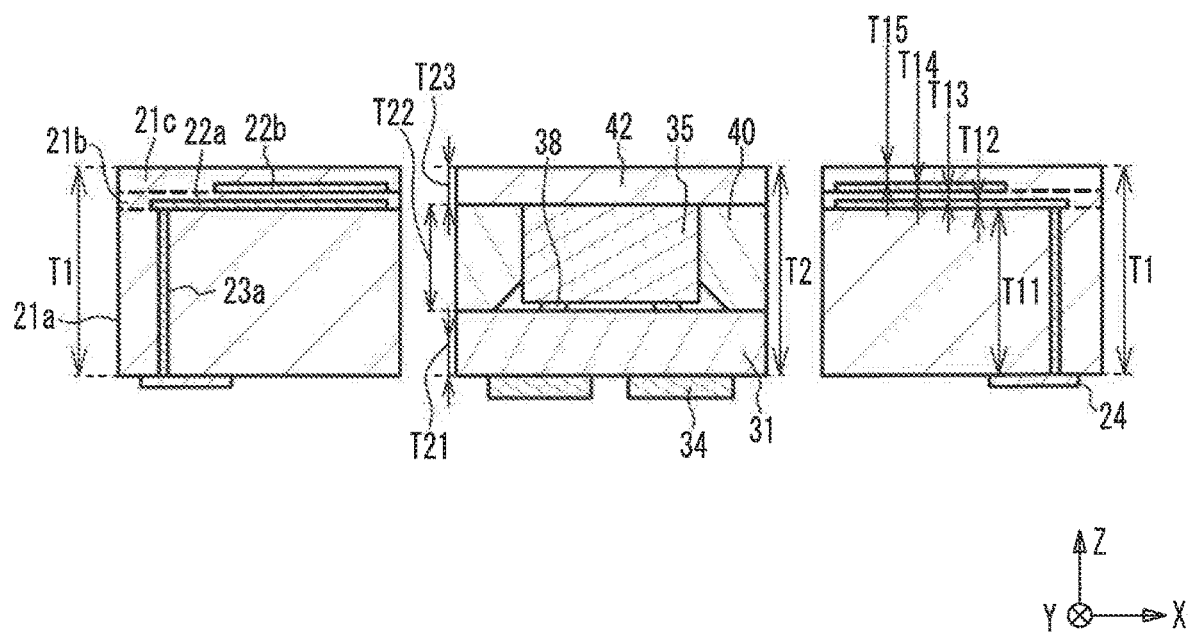
FIG. 8 is a cross-sectional view of the sample A.

FIG. 8 is a cross-sectional view of the sample A. As illustrated in FIG. 8, the height of the multilayered body 21 of each of the components 20a and 20b is T1. The dielectric layers 21a, 21b, and 21c have thicknesses of T11, T13, and T15, respectively. The metal patterns 22a and 22b have thicknesses of T12 and T14, respectively. The height of the component 30 excluding the terminal 34 is T2. The wiring substrate 31, the sealing portion 40, and the lid 42 have thicknesses of T21, T22, and T23, respectively.

The material and dimensions of each element are as follows.

Dielectric layers 21a through 21c: Diopside (main component)

Metal patterns 22a and 22b: Silver layer

Sealing portion 40: Tin silver solder

Substrate 35: 42° rotated Y-cut X-propagation lithium tantalate substrate

Lid 42: Kovar

X1: 800 μm, Y1: 800 μm, X2: 900 μm, Y2: 1100 μm, X3: 150 μm, D1: 650 μm, D2: 660 μm, D3: 205 μm, D4: 40 μm, D5: 75 μm, D6: 25 μm

Electrical characteristics of the elements are as follows.

Inductance

L1: 4.0 nH, L2: 4.0 nH, L3: 3.1 nH

Capacitance

C1: 9.0 pF, C2: 9.0 pF

Acoustic wave resonator: Electrostatic capacitance of 2.2 pF

Resonant frequency: 1.68 GHz, Antiresonant frequency: 1.73 GHz

Figure 9A:
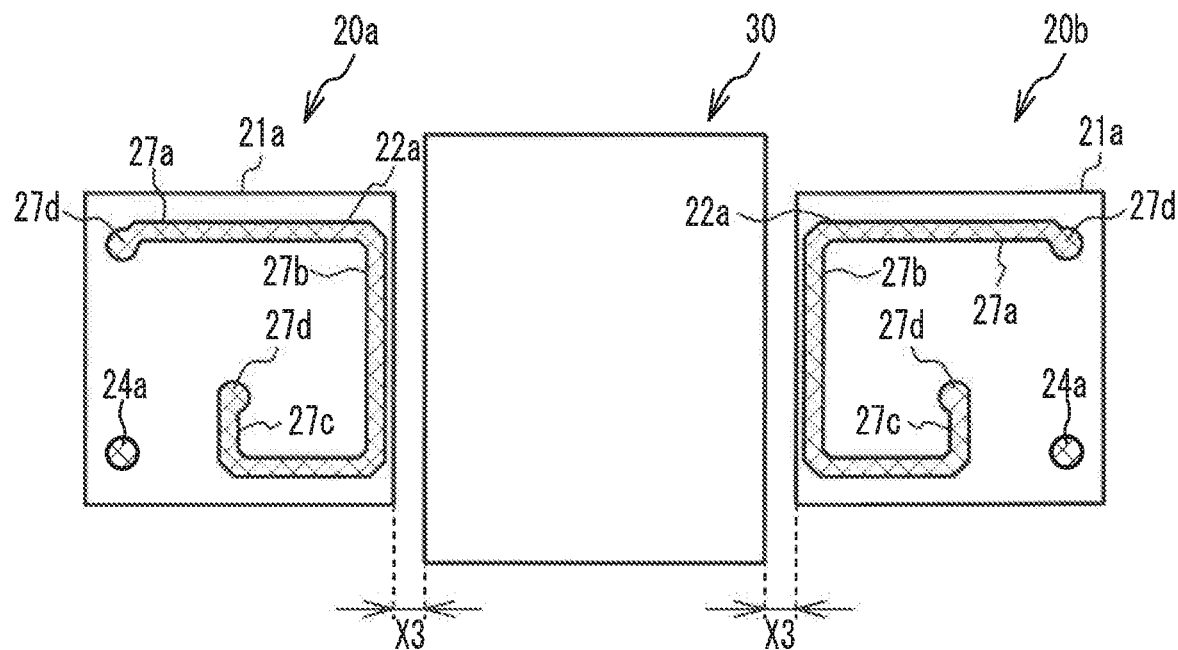
FIG. 9A and FIG. 9B are plan views of a sample B.
Figure 9B:
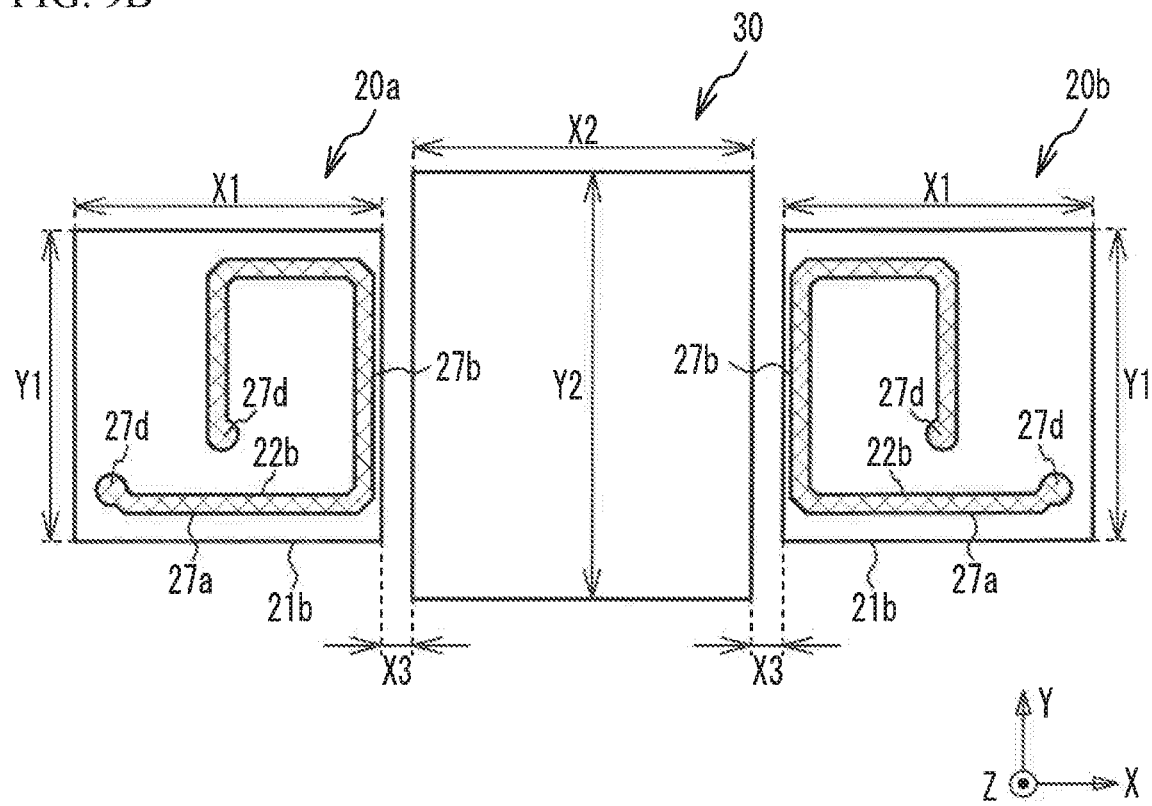

FIG. 9A and FIG. 9B are plan views of the sample B. FIG. 9A illustrates mainly the metal patterns 22a on the dielectric layers 21a in the components 20a and 20b, and FIG. 9B illustrates mainly the metal patterns 22b on the dielectric layers 21b. As illustrated in FIG. 9A and FIG. 9B, the distance X3 between the components 20a and 30 and the distance X3 between the components 20b and 30 are smaller than those in the sample A, and X3 is 50 μm. Other structures are the same as those of the sample A, and the description thereof is thus omitted.

Figure 10A:
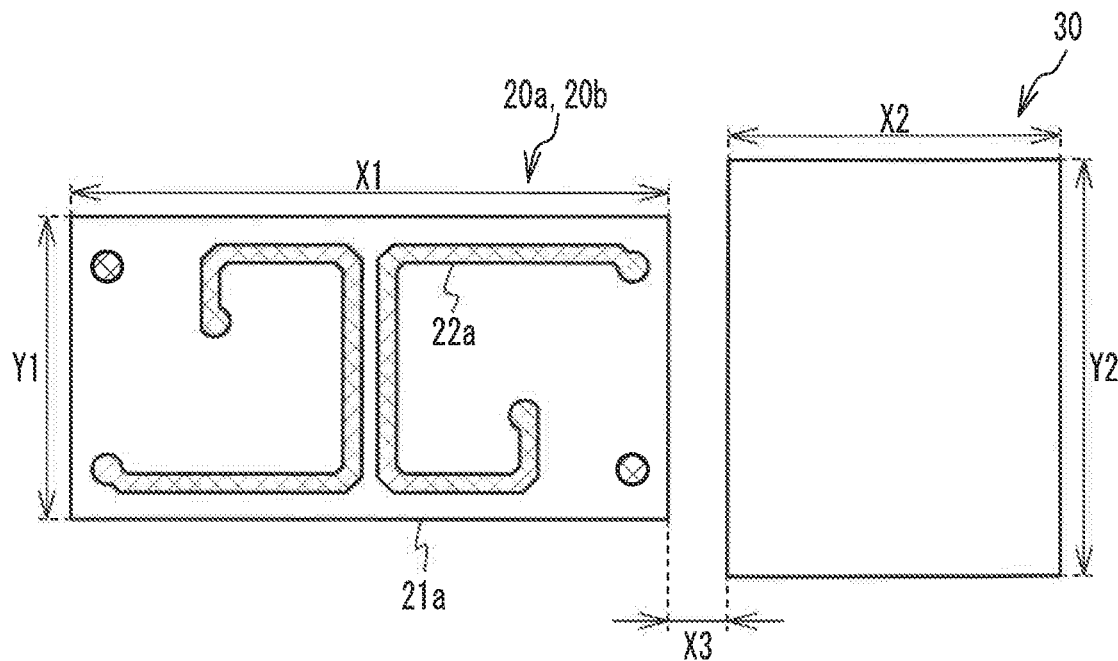
FIG. 10A and FIG. 10B are plan views of a sample C.
Figure 10B:
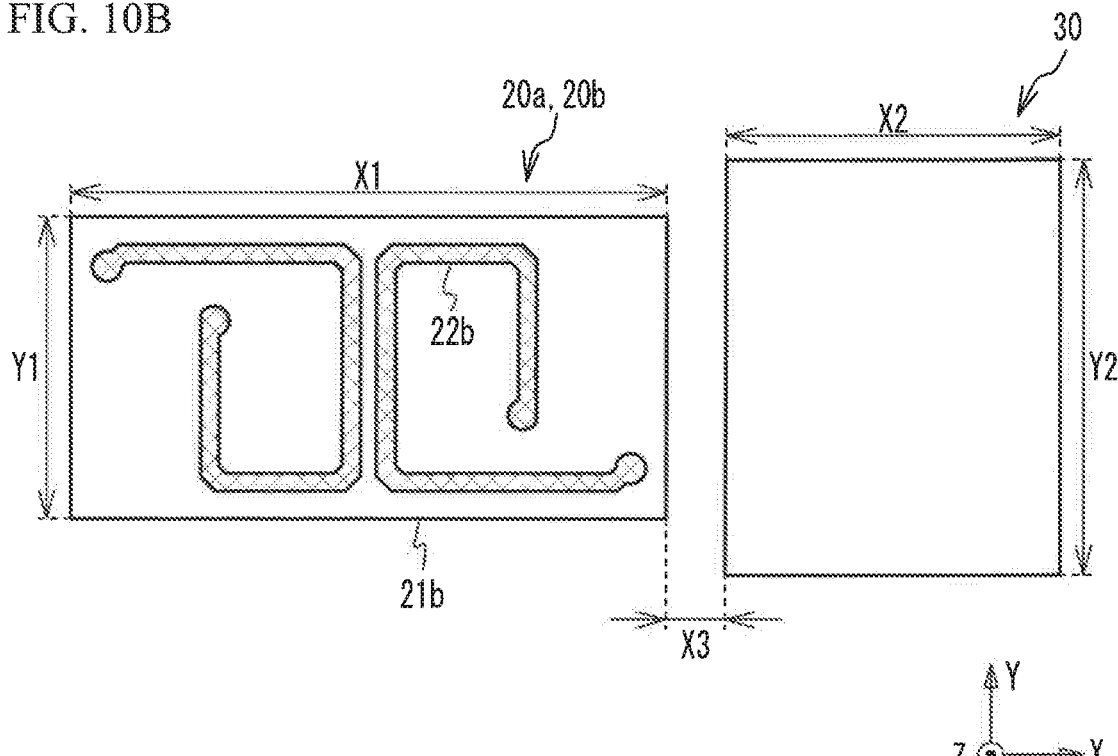

FIG. 10A and FIG. 10B are plan views of the sample C. FIG. 10A illustrates mainly the metal patterns 22a on the dielectric layers 21a in the components 20a and 20b, and FIG. 10B illustrates mainly the metal patterns 22b on the dielectric layers 21b. As illustrated in FIG. 10A and FIG. 10B, the components 20a and 20b are formed as one component. The distance X3 between the components 20a and 20b and 30 is 50 μm, which is the same as that in the sample B. Other structures are the same as those of the sample B, and the description thereof is thus omitted.

Figure 11:
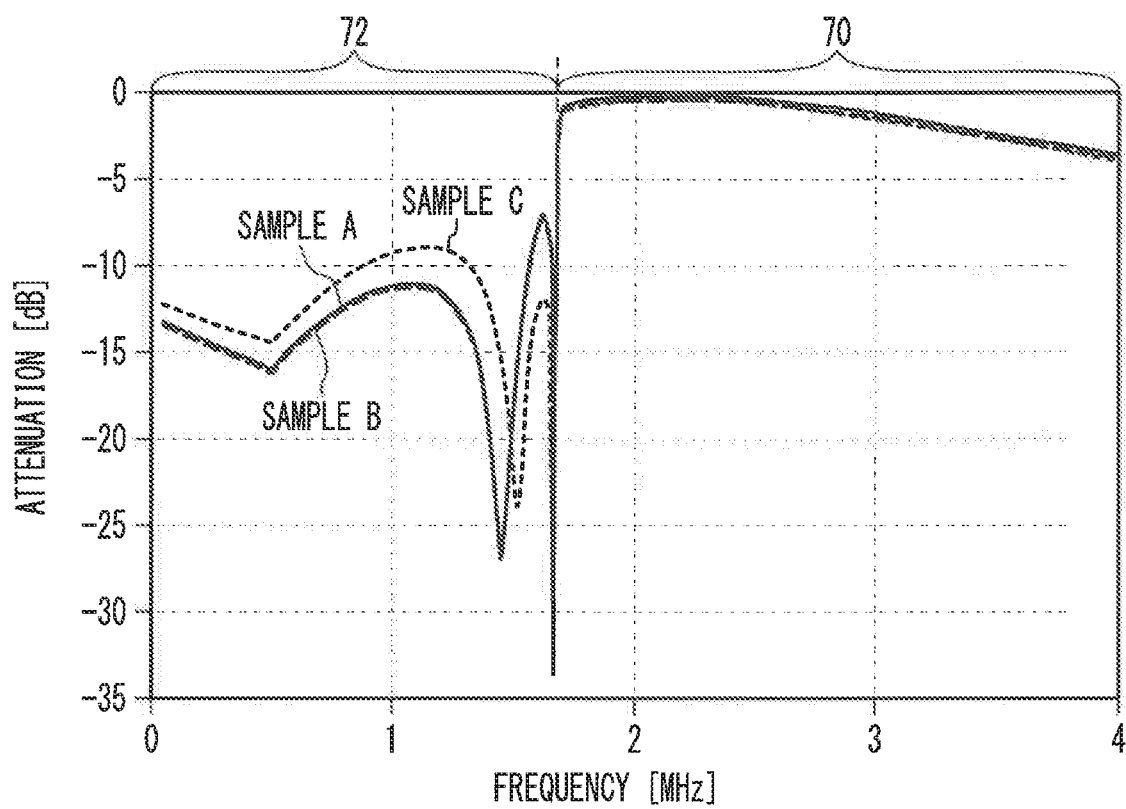
FIG. 11 illustrates transmission characteristics of the samples A to C.

FIG. 11 illustrates transmission characteristics of the samples A through C. As illustrated in FIG. 11, the loss in the passband 70 is almost the same among the samples A through C. The attenuation in the stopband 72 in each of the samples A and B is smaller than that in the sample C at 1.4 GHz or lower.

Figure 12A:
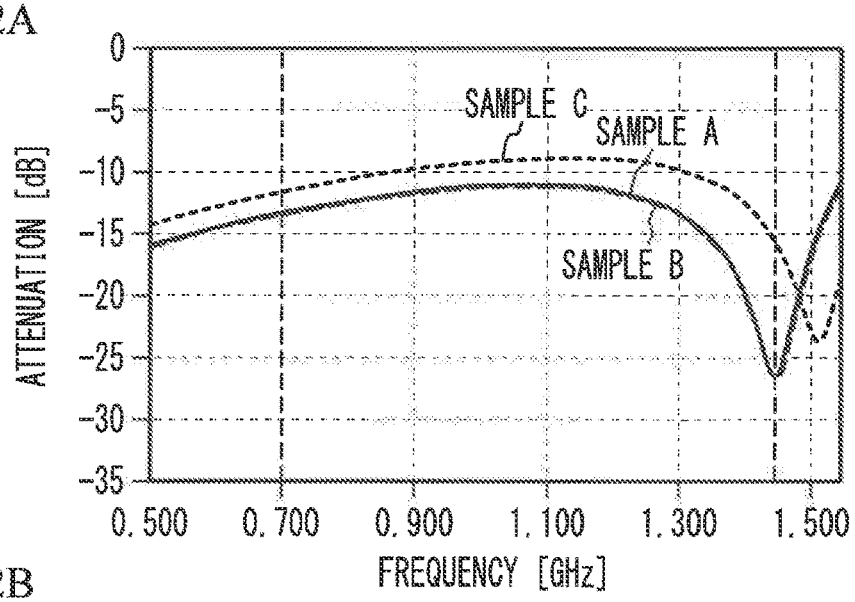
FIG. 12A through FIG. 12C are enlarged views of the transmission characteristics of the samples A through C.
Figure 12B:
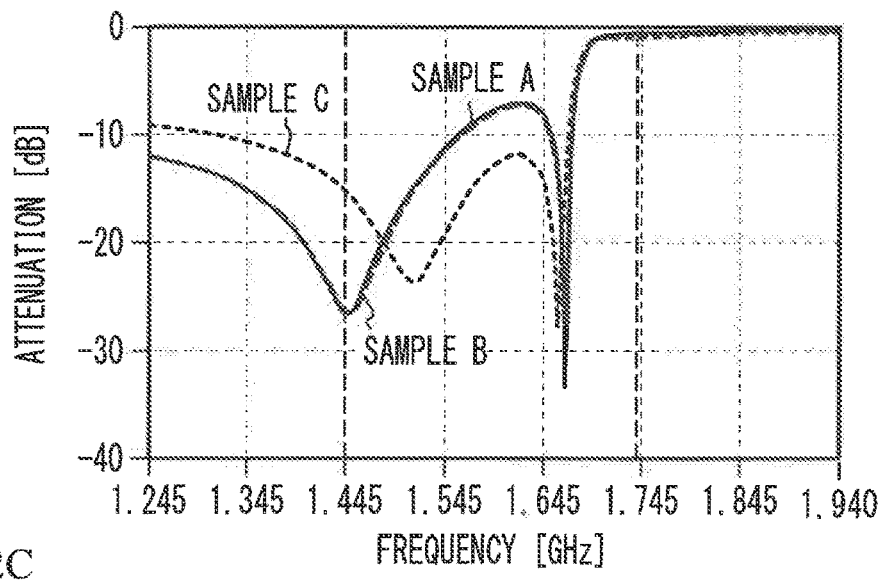
Figure 12C:
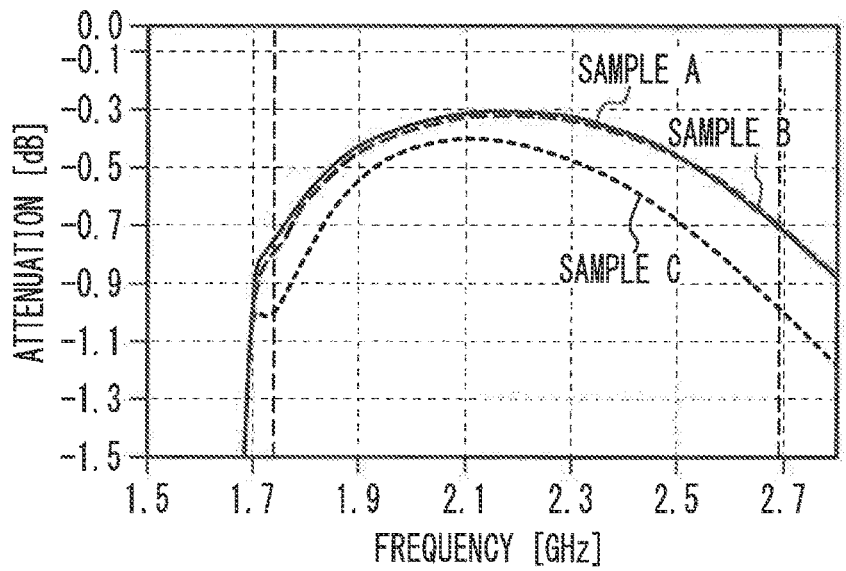

FIG. 12A through FIG. 12C are enlarged views of the transmission characteristics in the samples A through C. FIG. 12A is an enlarged view of a low-frequency region of the stopband 72, FIG. 12B is an enlarged view of the region between the stopband 72 and the passband 70, and FIG. 12C is an enlarged view of the passband. Table 1 lists the attenuation of the samples A through C.

TABLE 1

| Sample | 0.700 GHz | 1.445 GHz | 1.740 GHz | 2.690 GHz |
|---|---|---|---|---|
| A | −13.385 dB | −26.542 dB | −0.753 dB | −0.697 dB |
| B | −13.481 dB | −26.516 dB | −0.795 dB | −0.693 dB |
| C | −11.742 dB | −15.592 dB | −1.000 dB | −0.981 dB |

As presented in FIG. 12A and Table 1, in the low frequency band (for example, at 0.7 GHz and 1.445 GHz) within the stopband 72, the attenuation of each of the samples A and B is larger than that of the sample C. The attenuation is substantially the same between the samples A and B. As presented in FIG. 126 and Table 1, in the region (for example, at 1.74 GHz) between the stopband 72 and the passband 70, the attenuation of each of the samples A and B is smaller than that of the sample C. As presented in FIG. 12C and Table 1, in the passband 70 (for example, at 2.69 GHz), the loss of each of the samples A and B is smaller than that of the sample C.

As described above, the samples A and B have larger attenuation than the sample C in the stopband 72, and smaller loss than the sample C in the passband 70. Between the samples A and B, there is no significant difference in the attenuation in the stopband 72 and the loss in the passband 70.

In the sample C, as illustrated in FIG. 10A and FIG. 10B, the components 20a and 20b respectively including the inductors L1 and L2 are adjacent to each other. This structure couples the electromagnetic fields of the inductors L1 and L2. For example, the mutual inductance between the inductors L1 and L2 increases. This leads to the change in the inductances of the inductors L1 and L2 from the designed inductance. In addition, the Q-values of the inductors L1 and L2 decrease. Thus, the attenuation in the stopband 72 decreases and the loss in the passband 70 increases.

On the other hand, in the samples A and B, as illustrated in FIG. 7A through FIG. 9B, the component 30 is mounted between the components 20a and 20b respectively including the inductors L1 and L2. Thus, the electromagnetic field coupling between the inductors L1 and L2 is inhibited by the component 30. Therefore, the change in the inductances of the inductors L1 and L2 from the designed value is reduced. In addition, the decrease in the 0-values of the inductors L1 and L2 is reduced. Therefore, decrease in the attenuation in the stopband 72 and increase in the loss in the passband 70 are inhibited.

As clear from the comparison between the samples A and B, when the component 30 is located between the components 20a and 20b, the attenuation in the stopband 72 and the loss in the passband 70 do not depend on the distance X3 so much. Therefore, X3 can be shortened, and the filter can be thereby reduced in size.

In the first embodiment, as illustrated in FIG. 1, the resonant circuit 60 is located in a series pathway between the input terminal Tin and the output terminal Tout. The inductor L1 (a first inductor) has a first end electrically connected to the node N1 (a first node) in the series pathway and a second end electrically connected to a ground. The inductor L2 (a second inductor) has a first end electrically connected to the node N2 (a second node), which differs from the node N1, in the series pathway and a second end electrically connected to a ground. The acoustic wave resonator R has a first end electrically connected to the node N3 (a third node) located between the nodes N1 and N2 in the series pathway and a second end electrically connected to a ground.

In the filter as configured above, as illustrated in FIG. 3A and FIG. 3B, the component 20a (a first component) including the inductor L1 is mounted in a first region on the circuit substrate 10. The component 20b (a second component) including the inductor L2 is mounted in a second region, which differs from the first region, on the circuit substrate 10. The component 30 (a third component) including the acoustic wave resonator R is mounted in a third region located between the first region and the second region on the circuit substrate 10. This structure increases the distance between the components 20a and 20b. Thus, the electromagnetic field coupling between the inductors L1 and L2 is inhibited. Accordingly, the inductances of the inductors L1 and L2 are inhibited from changing from the designed value. In addition, decrease in the 0-values of the inductors L1 and L2 is reduced. Thus, the filter characteristics such as the attenuation and the loss are improved.

At least a part of a first side surface, facing the component 20a, of the component 30 and a second side surface, facing the component 20b, of the component 30 is covered with the sealing portion 40 and the lid 42 (a metal layer). This structure further inhibits the electromagnetic field coupling between the components 20a and 20b.

As illustrated in FIG. 7A through FIG. 9B, all the virtual lines that virtually connect between the metal patterns 22a and 22b forming the inductor L1 and the metal patterns 22a and 22b forming the inductor L2 pass through the sealing portion 40 and/or the lid 42. This structure further inhibits the electromagnetic field coupling between the inductors L1 and L2.

To achieve the aforementioned structure, the lengths in the Y direction of the sealing portion 40 and the lid 42 of the component 30 are preferably configured to be greater than the lengths in the Y direction of the metal patterns 22a and 22b forming the inductors L1 and L2. The upper surface of the lid 42 is preferably located higher than the upper surface of the metal pattern 22b, and the lower surface of the sealing portion 40 is preferably located lower than the lower surface of the metal pattern 22a.

As illustrated in FIG. 3A, the planar shape of the component 30 is a substantially rectangle, and the components 20a and 20b are arranged in the long-side direction of the rectangle. This structure increases the distance between the components 20a and 20b. Thus, the electromagnetic field coupling between the inductors L1 and L2 is further inhibited.

As the size of the filter is decreased, the coupling between the inductors L1 and L2 increases. In the first embodiment, since the component 30 is located between the components 20a and 20b, even when the filter is reduced in size, deterioration in the characteristics of the filter is inhibited as clear from the comparison between the samples A and B. In particular, since the component 30 is covered with a metal layer, deterioration in the characteristics of the filter is inhibited even when the filter is reduced in size. Thus, the interval between the components 20a and 30 and the interval between the components 20b and 30 (the distance X3) can be made to be less than the thickness of the thickest component among the components 20a, 20b, and 30. Therefore, the filter can be reduced in size. The distance X3 is preferably equal to or less than one-half of, more preferably equal to or less than one-third of the thickness of the thickest component among the components 20a, 20b, and 30.

The resonant circuit 60 is an LC resonant circuit including an inductor and a capacitor. This structure reduces deterioration in the characteristics in the filter including an LC resonant circuit and an acoustic wave resonator.

As illustrated in FIG. 1, the resonant circuit 60 includes the capacitor C1 (a first capacitor), the capacitor C2 (a second capacitor), and the inductor L3 (a third inductor). The capacitor C1 has a first end coupled to the node N1 and a second end coupled to the node N3. The capacitor C2 has a first end coupled to the node N2 and a second end coupled to the node N3. The inductor L3 has a first end coupled to the node N1 and a second end coupled to the node N2. This structure allows the filter to function as a low-pass filter or a high-pass filter, and reduces deterioration in the filter characteristics due to the electromagnetic field coupling between the inductors L1 and L2.

It is sufficient if a passive element (a first passive element) having a first end coupled to the node N1 and a second end coupled to the node N3 is an inductor or a capacitor. It is sufficient if a passive element (a second passive element) having a first end coupled to the node N2 and a second end coupled to the node N3 is an inductor or a capacitor.

The resonant frequency of the acoustic wave resonator R is located between the passband 70 of the filter 100 and the attenuation pole A2 (a first attenuation pole) formed mainly by the resonant circuit 60. The attenuation pole A2 is located between the attenuation pole A3 (a second attenuation pole) formed mainly by the inductors L1 and L2 and the resonant frequency of the acoustic wave resonator R. Accordingly, in the low-pass filter and the high-pass filter, the steepness in the transition region between the passband 70 and the stopband 72 is increased, and the stopband 72 is widened.

As illustrated in FIG. 7A through FIG. 9B, the components 20a and 20b include the dielectric layers 21a through 21c (a first dielectric layer and a second dielectric layer) that are stacked and one or more metal patterns 22a and 22b (a first metal pattern and a second metal pattern) sandwiched between respective two of the dielectric layers 21a through 21c. As seen above, the components 20a and 20b can be formed of the multilayered body 21. The components 20a and 20b may have a structure other than the multilayered body.

The acoustic wave resonator R (for example, a surface acoustic wave resonator or a piezoelectric thin film resonator) is preferably used as a resonator. This configuration increases the steepness of the transition region between the passband 70 and the stopband 72.

Second Embodiment

Figure 13:
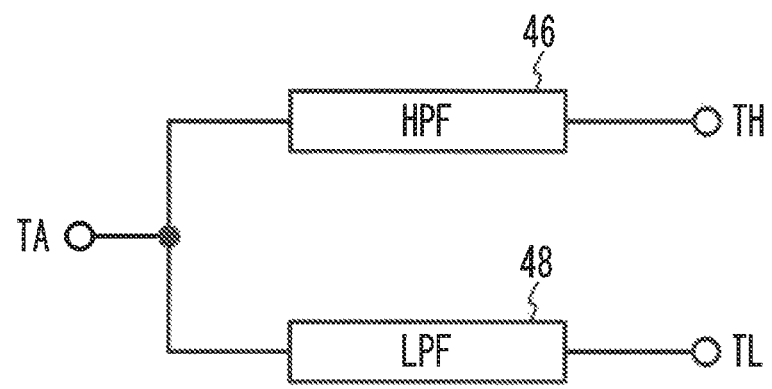
FIG. 13 is a circuit diagram of a diplexer in accordance with a second embodiment.

FIG. 13 is a circuit diagram of a diplexer in accordance with a second embodiment. As illustrated in FIG. 13, a high-pass filter 46 is connected between a common terminal TA and a terminal TH. A low-pass filter 48 is connected between the common terminal TA and a terminal TL. The high-pass filter 46 transmits signals in the passband to the terminal TH or the common terminal TA among high-frequency signals input from the common terminal TA or the terminal TH, and suppresses signals with other frequencies. The low-pass filter 48 transmits signals in the passband to the terminal TL or the common terminal TA among high-frequency signals input from the common terminal TA and the terminal TL, and suppresses signals with other frequencies. A bandpass filter may be provided instead of at least one of the high-pass filter 46 and the low-pass filter 48. At least one of the high-pass filter 46 and the low-pass filter 48 may be the filter of the first embodiment.

The diplexer has been described as a multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. A filter comprising:
   a substrate;
   an input terminal located on the substrate;
   an output terminal located on the substrate;
   a resonant circuit located in a series pathway between the input terminal and the output terminal;
   a first component including a first inductor and mounted in a first region on the substrate, the first inductor having a first end electrically connected to a first node in the series pathway and a second end electrically connected to a ground;
   a second component including a second inductor and mounted in a second region on the substrate, the second inductor having a first end electrically connected to a second node in the series pathway and a second end electrically connected to a ground, the second node being different from the first node, the second region being different from the first region; and
   a third component including an acoustic wave resonator and mounted in a third region on the substrate, the acoustic wave resonator having a first end electrically connected to a third node in the series pathway and a second end electrically connected to a ground, the third node being located between the first node and the second node, the third region being located between the first region and the second region.

2. The filter according to claim 1, wherein
   at least a part of a first side surface and a second side surface of the third component is covered with a metal layer, the first side surface facing the first component, the second side surface facing the second component.

3. The filter according to claim 2, wherein
   all virtual lines between the first inductor and the second inductor pass through the metal layer.

4. The filter according to claim 1, wherein
   a planar shape of the third component is a substantially rectangle, and
   the first component and the second component are arranged in a long-side direction of the substantially rectangle.

5. The filter according to claim 1,
   each of an interval between the first component and the third component and an interval between the second component and the third component is less than a thickness of a thickest component among the first component, the second component, and the third component.

6. The filter according to claim 1, wherein
   the resonant circuit is an LC resonant circuit.

7. The filter according to claim 1, wherein
   the resonant circuit includes a first capacitor, a second capacitor, and a third inductor, the first capacitor having a first end coupled to the first node and a second end coupled to the third node, the second capacitor having a first end coupled to the second node and a second end coupled to the third node, the third inductor having a first end coupled to the first node and a second end coupled to the second node.

8. The filter according to claim 1, wherein
   a resonant frequency of the acoustic wave resonator is located between a passband of the filter and a first attenuation pole formed mainly by the resonant circuit, and the first attenuation pole is located between the resonant frequency and a second attenuation pole formed mainly by the first inductor and the second inductor.

9. The filter according to claim 1, wherein
the first component includes a plurality of first dielectric layers and one or more first metal patterns, the plurality of first dielectric layers being stacked, the one or more first metal patterns being sandwiched between respective two of the plurality of first dielectric layers,
the first inductor includes at least one of the one or more first metal patterns,
the second component includes a plurality of second dielectric layers and one or more second metal patterns, the plurality of second dielectric layers being stacked, the one or more second metal patterns being sandwiched between respective two of the plurality of second dielectric layers, and
the second inductor includes at least one of the one or more second metal patterns.

10. A multiplexer comprising:
a filter including:
   a substrate;
   an input terminal located on the substrate;
   an output terminal located on the substrate;
   a resonant circuit located in a series pathway between the input terminal and the output terminal;
   a first component including a first inductor and mounted in a first region on the substrate, the first inductor having a first end electrically connected to a first node in the series pathway and a second end electrically connected to a ground;
   a second component including a second inductor and mounted in a second region on the substrate, the second inductor having a first end electrically connected to a second node in the series pathway and a second end electrically connected to a ground, the second node being different from the first node, the second region being different from the first region; and
   a third component including an acoustic wave resonator and mounted in a third region on the substrate, the acoustic wave resonator having a first end electrically connected to a third node in the series pathway and a second end electrically connected to a ground, the third node being located between the first node and the second node, the third region being located between the first region and the second region.

* * * * *